United States Patent

Inoue et al.

[11] Patent Number: 5,954,262
[45] Date of Patent: Sep. 21, 1999

[54] SOLDERING APPARATUS FOR PROVIDING A FIXED QUANTITY OF SOLDER PIECE ONTO TARGET PLATE AND METHOD OF SOLDERING CIRCUIT COMPONENT

[75] Inventors: Akifumi Inoue; Koshiro Takeda, both of Shizuoka, Japan

[73] Assignee: Yamaha Corporation, Japan

[21] Appl. No.: 08/795,891

[22] Filed: Feb. 5, 1997

[30] Foreign Application Priority Data

Feb. 9, 1996 [JP] Japan ................................. 8-024383

[51] Int. Cl.⁶ ........................................................ H01R 4/02
[52] U.S. Cl. ........................ 228/245; 228/41; 228/244; 228/180.21; 228/56.3
[58] Field of Search ............................. 228/245, 41, 244, 228/180.21, 56.3

[56] References Cited

U.S. PATENT DOCUMENTS 5,372,295  12/1994  Abe et al. ............................. 228/123.1
5,508,561   4/1996  Tago et al. ............................. 257/737

FOREIGN PATENT DOCUMENTS 04101425  of 1990  Japan .
04101426  of 1992  Japan .
06246479  of 1993  Japan .
08083800  of 1994  Japan .

*Primary Examiner*—Patrick Ryan
*Assistant Examiner*—M. Alexandra Elve
*Attorney, Agent, or Firm*—Ostrolenk, Faber, Gerb & Soffen, LLP

[57] ABSTRACT

A punching pin of a soldering apparatus cuts out a solder piece from a solder plate onto a feeder pin, and the feeder pin presses the solder piece against a predetermined junction of a conductive wiring pattern incorporated in a printed circuit board; then, an electric circuit component is mounted on the printed circuit board, and is strongly soldered to the conductive wiring pattern, because the punching pin and the feeder pin supply a fixed amount of solder to the predetermined junction.

4 Claims, 8 Drawing Sheets

SOLDERING APPARATUS FOR PROVIDING A FIXED QUANTITY OF SOLDER PIECE ONTO TARGET PLATE AND METHOD OF SOLDERING CIRCUIT COMPONENT

FIELD OF THE INVENTION

This invention relates to a semiconductor assembly technology and, more particularly, to a soldering apparatus for providing a fixed quantity of solder piece to a printed circuit board and a method of soldering a circuit component to the printed circuit board.

DESCRIPTION OF THE RELATED ART

A module is a basic component unit of an electric system, and electric circuit components are assembled on a rigid or flexible board during a fabrication of the module. Bare chips are, by way of example, mounted on a printed circuit board, and a flexible board may be assembled with a rigid board. Thus, a micro-connecting technology is important factor of the fabrication of the module.

A typical example of the micro-connecting technology is known as a solder printing. The solder printing process has the following sequence. First, the manufacturer prepares a printed circuit board, a solder paste and a mask. A conductive wiring pattern is printed on the printed circuit board, and solder powder and binder form the solder paste. The mask has through-holes, and is aligned with the printed circuit board. Junctions of the conductive wiring pattern are exposed to the through-holes of the mask, and the solder paste is screen printed through the mask on the printed circuit board. Finally, bare chips are mounted on the printed circuit board, and the pins of the bare chips are soldered to the junctions of the conductive wiring pattern by applying heat to the solder.

Although the screen-printing exactly locates the solder paste on the junctions, the amount of solder paste is not constant. Especially, there is a tendency to scale down the module, and the junctions of the conductive wiring pattern are arranged to be close to one another. In this situation, the through-holes of the mask are miniaturized, and the miniature through-holes do not allow the solder paste to smoothly pass therethrough. This results in the fluctuation of the amount of solder paste on the junctions, and an electric circuit component is liable to be disconnected from the printed circuit board due to shortage of the solder.

SUMMARY OF THE INVENTION

It is therefore an important object of the present invention to provide a soldering apparatus which strongly fixes a component element to a target plate with a fixed amount of solder.

It is also an important object of the present invention to provide a method of strongly soldering a component element to a target plate with a fixed amount of solder.

To accomplish the object, the present invention proposes to cut out a piece of solder from a solder sheet onto a feeder which moves the piece of solder to a junction.

In accordance with one aspect of the present invention, there is provided a soldering apparatus comprising a solder piece provider for supplying at least one solder piece on a target layer, the solder piece provider comprising a die unit having at least one through-hole, a conveying mechanism selectively supplying a solder plate and a target layer in such a manner that the die unit is overlapped with one of the solder plate and the target plate, a punching mechanism moving a punching pin into and outof the through-hole so as to cut out a solder piece from the solder plate so as to leave the solder piece in the through hole, and a feeding mechanism moving a feeder pin in the through-hole so as to press the solder piece against the target layer.

In accordance with another aspect of the present invention, there is provided a micro-connecting method comprising the steps of: a) providing a solder plate on a die unit having at least one through-hole; b) pressing a punching pin against the solder plate so as to cut out a solder piece from the solder plate, the solder piece being left in the through-hole; c) removing the solder plate from the die unit; d) aligning a junction point of a target layer with the through-hole; e) moving a feeder pin in the through-hole so as to press the solder piece against the junction point; and f) soldering a component element to the junction by using the solder piece.

BRIEF DESCRIPTION OF THE DRAWINGS

The features and advantages of the soldering apparatus according to the present invention will be more clearly understood from the following description taken in conjunction with the accompanying drawings in which.

DESCRIPTION OF THE PREFERRED EMBODIMENTS

First Embodiment

Figure 1:
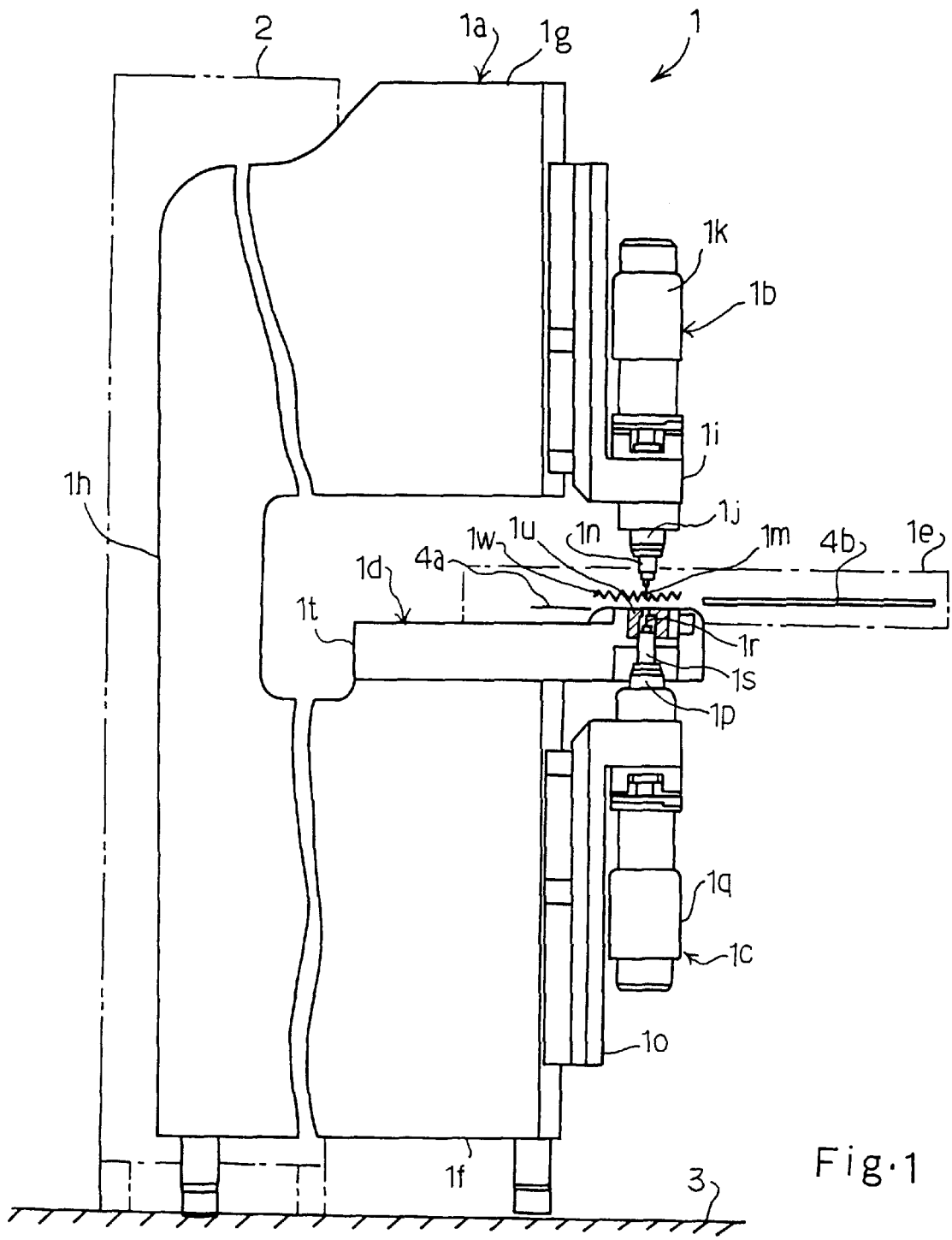
FIG. 1 is a side view showing the structure of a soldering apparatus according to the present invention.

Referring first to FIG. 1 of the drawings, a soldering apparatus embodying the present invention largely comprises a solder piece provider 1 and a mounter 2. The solder piece provider 1 supplies solder pieces onto junctions of a conductive wiring pattern on a printed circuit board, and the mounter 2 fixes an electric circuit component to the junctions by applying heat.

The solder piece provider 1 largely comprises a frame structure 1a, a punching mechanism 1b, a feeding mechanism 1c, a die 1d, a conveying mechanism 1e and a controller (not shown). These are detailed hereinbelow.

The frame structure 1a includes a lower portion 1f placed on a floor 3, an upper portion 1g over the lower portion 1f and a connecting portion 1h connecting the upper portion 1g to the lower portion 1f. The connecting portion 1h spaces the upper portion 1g from the lower portion 1f, and a gap takes place between the lower portion 1f and the upper portion 1g. The controller may be housed in the frame structure 1a so as to control the punching mechanism 1b, the feeding mechanism 1c and the conveying mechanism 1e.

The punching mechanism 1b includes a frame 1i, a rod member 1j, an actuator 1k, a punching pin 1m, and a suitable chuck 1n. The frame 1i is fixed to the front surface of the upper portion 1g, and the rod member 1j is slidably supported by the frame 1i. The actuator 1k is mounted on the frame 1i, and is connected to the rod member 1j. The rod member 1j is directed in the up-and-down direction, and the actuator 1k reciprocally drives the rod member 1j at high speed. The chuck 1n is attached to the lower end of the rod member 1j, and the punching pin 1m is fixed to the rod member 1j by means of the chuck 1n. Therefore, the punching pin 1m is also reciprocally driven in the up-and-down direction. The punching pin 1m is formed of cemented carbide, and the diameter of the punching pin 1m ranges from 50 microns to 100 microns. A manufacturer stores a plurality of punching pins 1m, and replaces the punching pin 1m with a new punching pin different in diameter depending upon the amount of solder piece to be requested.

The feeding mechanism 1c includes a frame 1o, a rod 1p. an actuator 1q, a feeder pin 1r and a chuck 1s. The frame 1o is fixed to the front surface of the lower portion 1f, and the rod member 1p is slidably supported by the frame 1o. The actuator 1q is mounted on the frame 1o, and is connected to the rod member 1p. The rod member 1p is directed in the up-and-down direction, and the actuator 1q reciprocally drives the rod member 1p. The chuck 1s is attached to the upper end of the rod member 1p, and the feeder pin 1r is fixed to the rod member 1p by means of the chuck 1s in such a manner that the feeder pin 1r is aligned with the punching pin 1m. The feeder pin 1r is also reciprocally driven in the up-and-down direction. However, the feeder pin 1r is moved slower than the punching pin 1m. However, the feeder pin 1r presses a solder piece against a rigid board, and large thrust is exerted on the feeder pin 1r in the direction of the center line thereof. For this reason, the feeder pin 1r is formed of material well withstood against the large thrust. The diameter of the punching pin 1m also ranges from 50 microns to 100 microns, and the manufacturer replaces the feeder pin 1r with a new feeder pin different in diameter depending upon the amount of solder piece to be requested.

The die 1d is mounted on the upper surface of the lower portion 1f, and includes a die holder 1t and a die unit 1u. The die holder 1t is fixed to the lower portion 1f, and maintains the die 1u between the punching mechanism 1b and the feeding mechanism 1c. The die 1u has a through-hole 1v (see FIGS. 2A to 2F), and the through-hole 1v is aligned with not only the punching pin 1m but also the feeder pin 1r. The die holder 1t maintains the die 1u to have the through-hole 1v exactly perpendicular to the trajectories of the punching/feeder pins 1m/1r, and the diameter of the through-hole 1v is slightly larger than the diameter of the punching pin 1m and the diameter of the feeder pin 1r. The manufacturer stores a plurality of die units 1u different in the diameter of the through-hole 1v, and replaces the die unit 1u depending upon the punching pin 1m and the feeder pin 1r.

When the punching pin 1m reaches the lower dead point, the leading end portion of the punching pin 1m is inserted into the through-hole 1v. On the other hand, while the feeder pin 1r is resting at the lower dead point, the leading end of the feeder pin 1r is in the through-hole. The actuator 1q upwardly pushes up the rod member 1s, and the leading end of the feeder pin 1r projects from the through-hole 1v.

The conveying mechanism 1e selectively conveys a solder plate 4a and a printed circuit board 4b over the die unit 1u, and aligns a junction 4c of a conductive wiring pattern 4d (see FIGS. 2D to 2F) with the through-hole 4v. Therefore, the conveying mechanism 1e not only selectively moves the solder plate 4a and the printed circuit board 4b over the die unit 1u but also regulates the solder plate 4a and the printed circuit board 4b to a target position through a two-dimensional motion. The solder plate 4a ranges from 30 microns to 60 microns in thickness.

A heater 1w is incorporated in the conveying mechanism 1e, and the heater 1w heats the printed circuit board to a certain temperature at which a solder piece is fusion bonded thereto.

Description is made on a micro-connecting method with reference to FIGS. 2A to 2G. First, the manufacturer prepares the soldering apparatus described hereinbefore and an electric circuit component 4e (see FIG. 2G) to be mounted on the printed circuit board 4b. The manufacturer provides the printed circuit board 4b and the solder plate 4a to the conveying mechanism 1e.

Figure 2A:
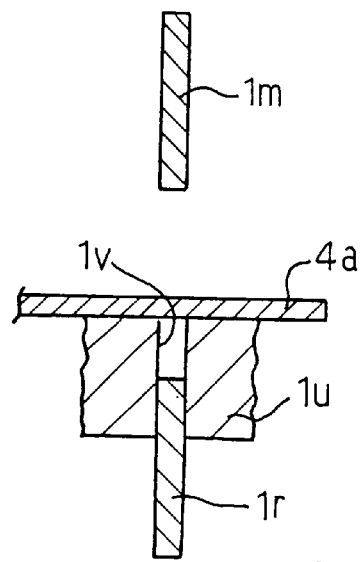
FIGS. 2A to 2G are cross sectional views showing a sequence of a micro-connecting method according to the present invention.

The conveying mechanism 1e firstly conveys the solder plate 4a to the die unit 1u, and the solder plate 4a is placed over the die unit 1u as shown in FIG. 2A. If a solder piece has been already cut out from the solder plate 4a, the conveying mechanism 1e places a different portion of the solder plate 4a on the die unit 1u. The feeding mechanism 1c maintains the feeder pin 1r at the lower dead point, and the leading end of the feeder pin 1r is retracted into the through-hole 1v.

Figure 2B:
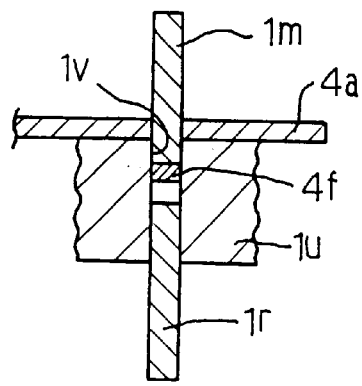

Subsequently, the actuator 1k downwardly moves the rod member 1j and, accordingly, the punching pin 1m at high speed. The punching pin 1m is brought into collision with the solder plate 4a, and cuts out a solder piece 4f as shown in FIG. 2B.

Figure 2C:
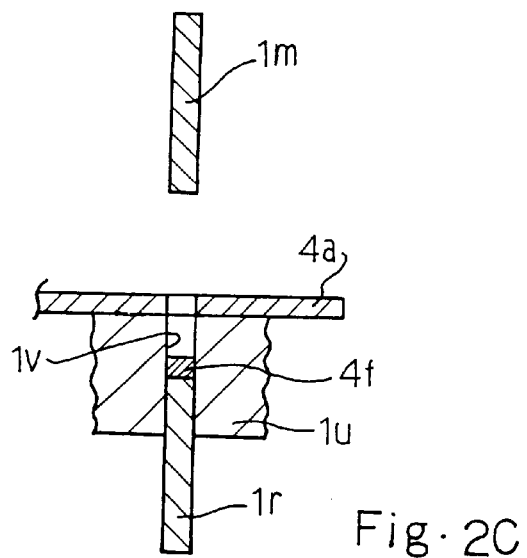

The solder piece is fallen onto the feeder pin 1r as shown in FIG. 2C, and the actuator 1k pulls up the rod member 1j and, accordingly, the punching pin 1m. As a result, the punching pin 1m is moved outof the die unit 1u. The volume of the solder piece 4f is determined by the thickness of the solder plate 4a and the diameter of the punching pin 1m. If the manufacturer wants to increase the volume of the solder piece 4f, he changes the set of punching pin 1m, feeder pin 1r and die unit 1u and/or the solder plate 4a different in thickness. In this way, the manufacturer can exactly control the amount of solder piece 4f.

Figure 2D:
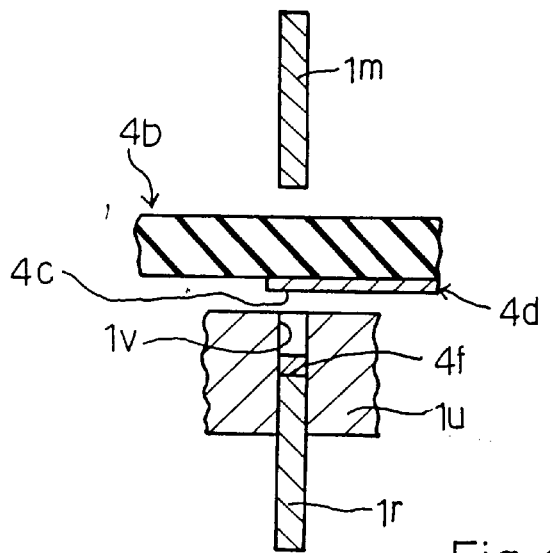

Subsequently, the conveying mechanism 1e removes the solder plate 4a from the die unit 1u, and conveys the printed circuit board 4b to the die unit 1u. The conveying mechanism 1e aligns the junction 4c of the conductive wiring pattern 4d of the printed circuit board 4b with the through-hole 1v of the die unit 1u as shown in FIG. 2D. The heater 1w heats the printed circuit board 4b to the certain temperature.

Figure 2E:
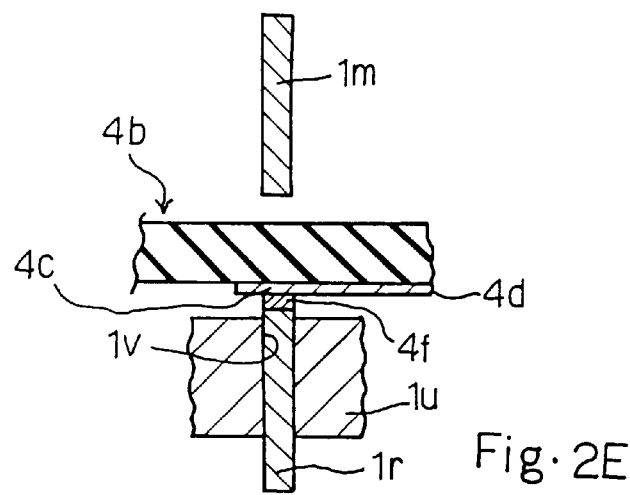

The actuator 1q upwardly moves the rod member 1p and, accordingly, the feeder pin 1r. The feeder pin 1r projects over the die unit 1u, and presses the solder piece 4f against the junction 4c as shown in FIG. 2E. The solder piece 4f is bonded to the junction 4d of the conductive wiring pattern 4c.

Figure 2F:
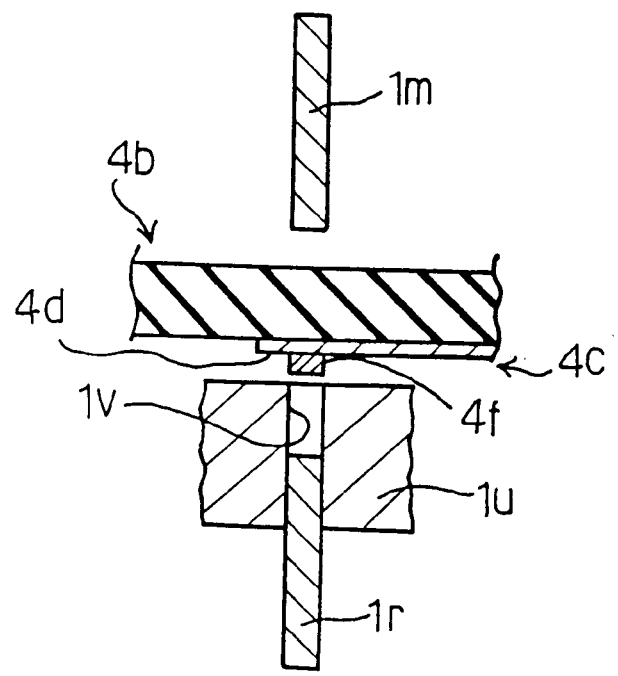

The actuator 1q downwardly moves the rod member 1p and the feeder pin 1r, and the feeder pin 1r is retracted into the through-hole 1v. The solder piece 4f is left on the junction 4c as shown in FIG. 2F.

The solder piece provider 1 repeats the above described steps, and a plurality of solder pieces 4f are bonded to the junctions 4d of the conductive wiring pattern 4c. The solder pieces 4f are exactly regulated to the predetermined volume.

Figure 2G:
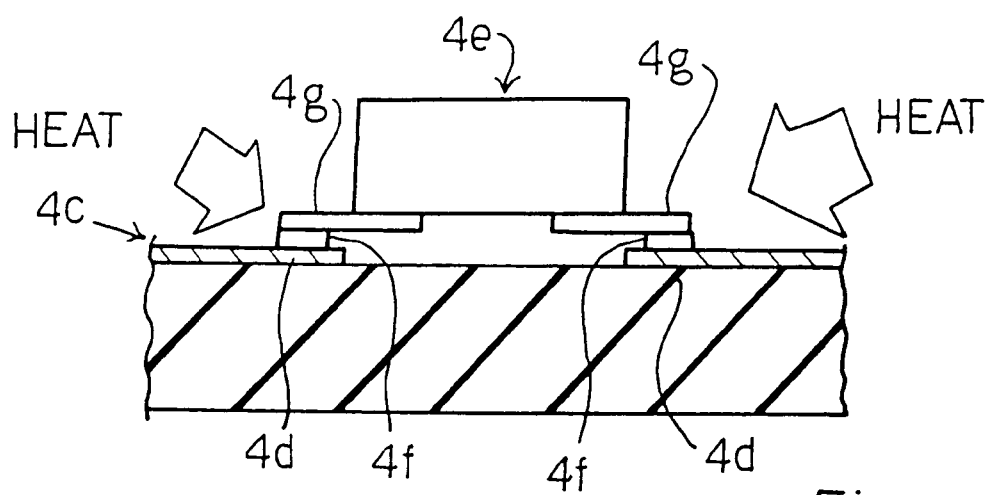

Subsequently, the printed circuit board 4a is conveyed to the mounter 2, and the electric circuit component 4e such as, for example, a bare chip is mounted on the printed circuit board 4a in such a manner that conductive pins 4g of the electric circuit component 4e are aligned through the solder pieces 4f with the junctions 4d of the conductive wiring pattern 4c. The mounter 2 applies heat to the solder pieces 4f, and the conductive pins 4g are connected to the conductive wiring pattern 4c as shown in FIG. 2G.

As will be appreciated from the foregoing description, the solder piece provider 2 supplies a fixed amount of solder pieces onto the conductive wiring pattern 4c or the target layer, and the solder pieces 4f strongly fix the electric circuit component 4e to the conductive wiring pattern 4c. Even if the electric circuit serves for long time period, the electric circuit component 4e is never disconnected from the conductive wiring pattern 4c due to shortage of solder.

Second Embodiment

Turning to FIGS. 3A to 3G of the drawings, another sequence of a micro-connecting method starts with preparation of a solder plate 11a and a printed circuit board 11b in a solder piece provider 10 according to the present invention. The solder piece provider 10 is different from the solder piece provider 1 in the location of the punching mechanism and the feeding mechanism and a through-hole 12a of a die unit 12b. The feeding mechanism is provided over the punching mechanism, and the through-hole 12a upwardly decreases the cross section. The other components of the solder piece provider 10 are similar to those of the solder piece provider 1, and are labeled with the references designating corresponding components of the solder piece provider 1 without detailed description.

Figure 3A:
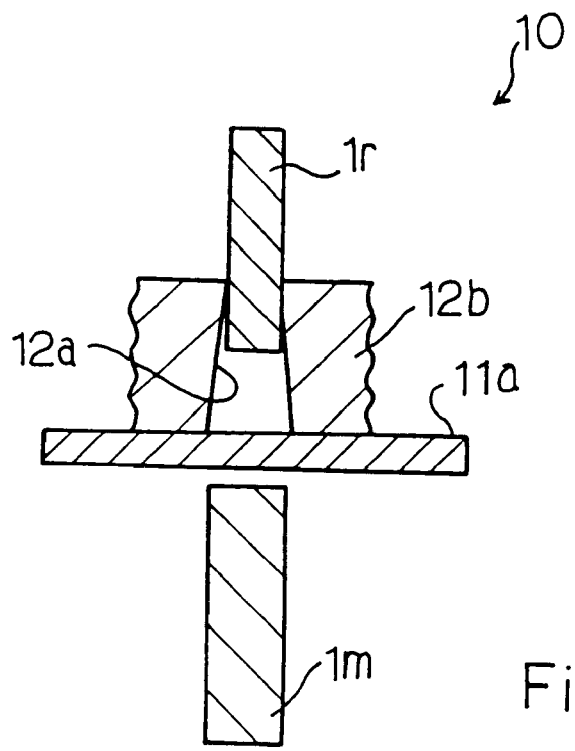
FIGS. 3A to 3G are cross sectional views showing another sequence of a micro-connecting method according to the present invention.
Figure 3B:
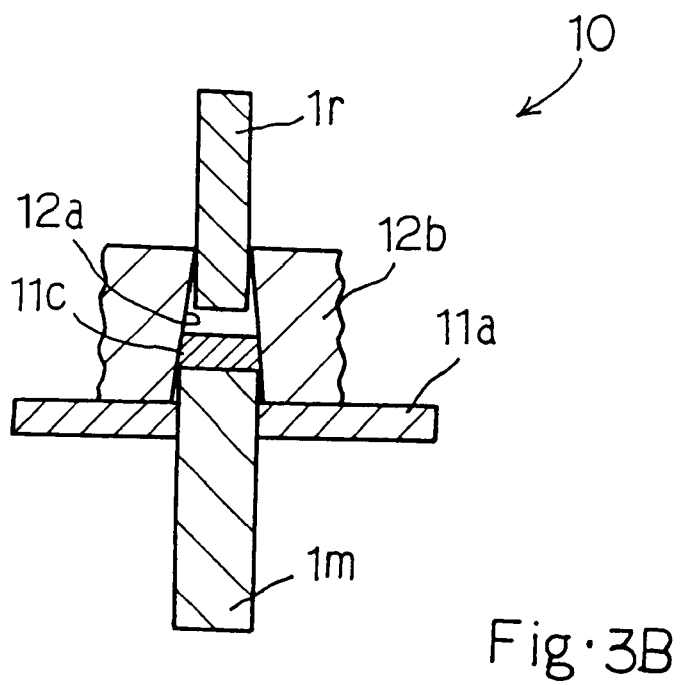

The solder plate 1a is placed under the die unit 12b as shown in FIG. 3A. Then, the punching pin 1m is upwardly moved, and the leading end of the punching pin 1m is inserted into the through-hole 12a. A solder piece 1c is cut out from the solder plate 11a (see FIG. 3B), and the through-hole 12a is clogged with the solder piece, because the through-hole 12a narrows toward the upper end.

Figure 3C:
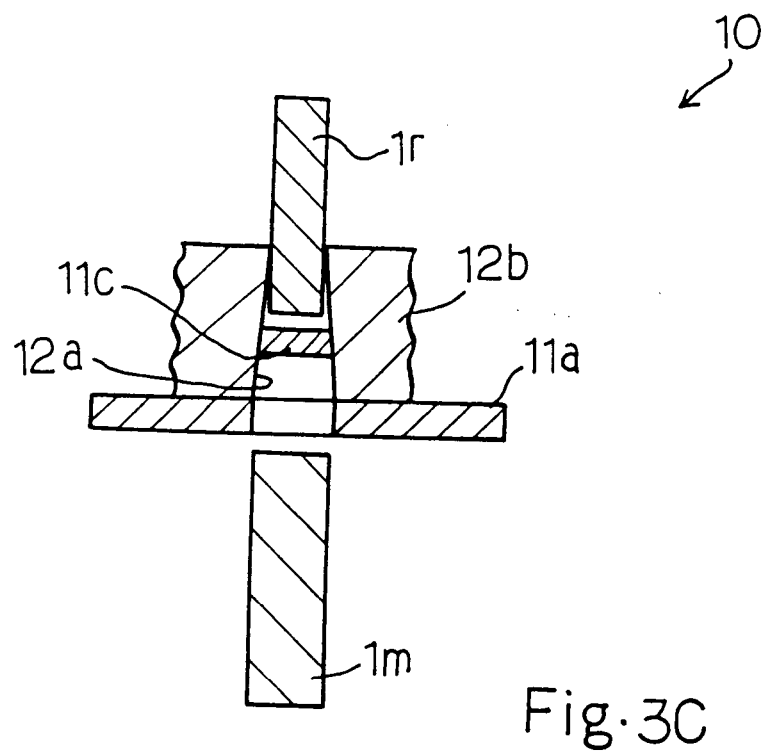
Figure 3D:
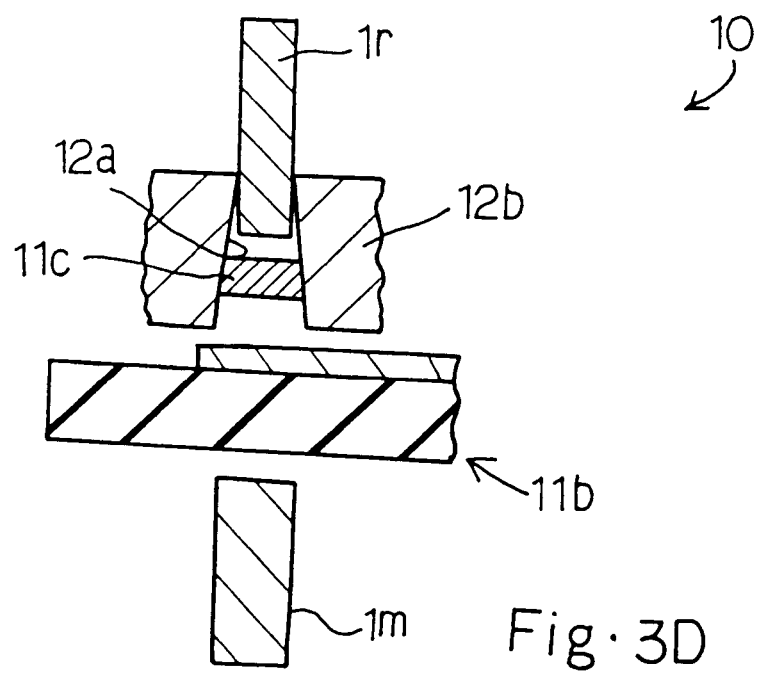

The punching pin 1m is downwardly moved, and the solder piece 11c is left in the through-hole 12a as shown in FIG. 3C. The conveying mechanism 1e removes the solder plate 11a from under the die unit 12b, and the printed circuit board 11b is placed under the die unit 12b as shown in FIG. 3D.

Figure 3E:
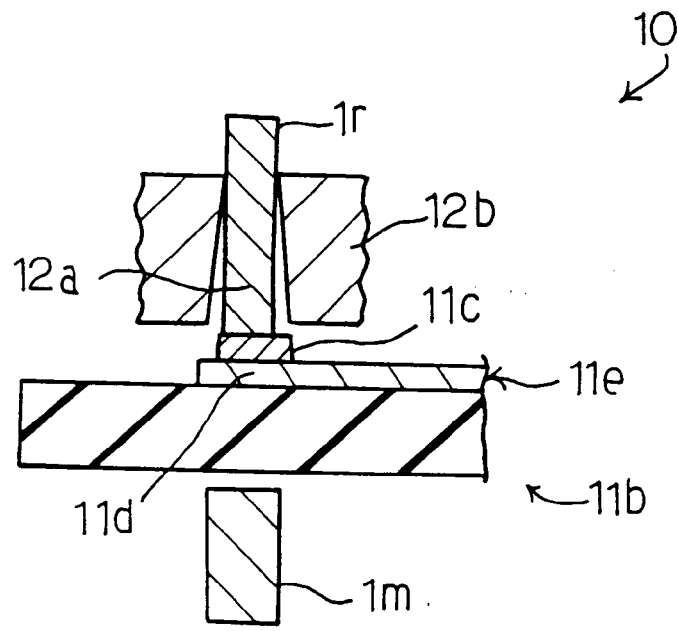

The feeder pin 1r is downwardly moved, and pushes out the solder piece 11c from the through-hole 12a. The feeder pin 1r presses the solder piece 11c against a junction 11d of a conductive wiring pattern 11e of the printed circuit board 11b. The printed circuit board 11b has been already heated to the certain temperature, and the solder piece 11c is bonded to the junction 11d of the conductive wiring pattern 11e as shown in FIG. 3E.

Figure 3F:
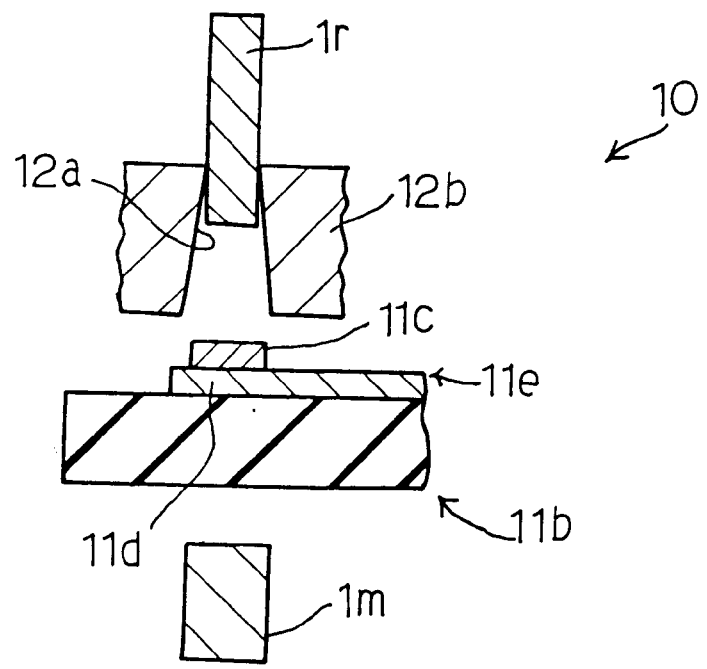
Figure 3G:
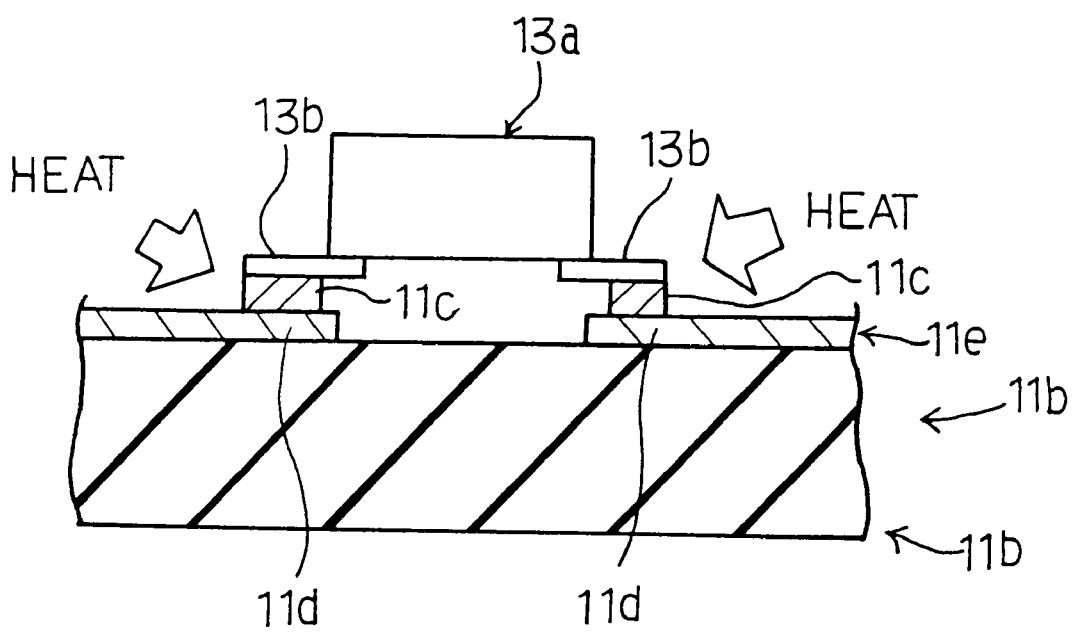

The feeder pin 1r is upwardly moved, and is retracted into the die unit 12b as shown in FIG. 3F. The printed circuit board 11b is conveyed to the mounter 2, and an electric circuit component 13a is mounted on the printed circuit board 11b, and the solder pieces 11c are overlapped with pins 13b of the electric circuit components 13a. Heat is applied to the solder pieces 11c, and the solder pieces 11c bond the pins 13b to the junctions 11d.

The second embodiment achieves all the advantages of the first embodiment.

Although particular embodiments of the present invention have been shown and described, it will be obvious to those skilled in the art that various changes and modifications may be made without departing from the spirit and scope of the present invention.

For example, a plurality of punching pins and a plurality of feeder pins may be incorporated in the punching mechanism and the feeding mechanism so as to concurrently supply solder pieces to a printed circuit board.

In the above described embodiments, the die unit 1u is stationary, and the conveying mechanism 1e two-dimensionally moves the solder plate 4a and the printed circuit board 4b so as to locate them at a target position. However, another solder piece provider according to the present invention may move the die unit 1u, the punching mechanism 1b and the feeding mechanism 1c with respect to the solder plate 4a and the printed circuit board 4b.

The solder piece provider according to the present invention may be used for a die bonding between a lead frame and a semiconductor chip or any kind of soldering for micro-components.

What is claimed is:

1. A micro-connecting method comprising the steps of:
    (a) providing a solder plate on a die unit having at least one through-hole;
    (b) pressing a punching pin at a first speed against said solder plate so as to cut out a solder piece from said solder plate, said solder piece being left in said through-hole;
    (c) removing said solder plate from said die unit;
    (d) aligning a junction point of a target piece with said through-hole;
    (e) moving a feeder pin into said through hole at a second speed less than said first speed of said punching pin so as to push said solder piece from said through-hole to said junction point such that said solder piece adheres to said junction point; and
    (f) soldering a component element to said junction by using said solder piece.

2. The micro-connecting method as set forth in claim 1, in which said junction point is heated so that said solder piece is bonded thereto in said step e).

3. The micro-connecting method as set forth in claim 1, in which said solder piece is fallen onto said feeder pin stored in said through-hole in said step b).

4. The micro-connecting method as set forth in claim 1, in which said through-hole is clogged with said solder piece in said step b), and said feeder pin pushes out said solder piece from said through-hole onto said junction point in said step e).

* * * * *